United States Patent [19]
Shao

[11] 3,742,317
[45] June 26, 1973

[54] SCHOTTKY BARRIER DIODE

[75] Inventor: Tzu Fann Shao, Dallas, Tex.

[73] Assignee: Instruments Incorporated, Dallas, Tex.

[22] Filed: Sept. 2, 1970

[21] Appl. No.: 69,062

[52] U.S. Cl. .. 317/235 R, 317/235 T, 317/235 UA, 317/235 AM
[51] Int. Cl. .............................................. H01l 9/00
[58] Field of Search......................317/30 317/235

[56] References Cited

UNITED STATES PATENTS

| | | | |
|---|---|---|---|
| 3,550,260 | 12/1970 | Saltich et al. | 29/576 |
| 3,646,411 | 2/1972 | Iwasa | 317/235 |

*Primary Examiner*—John W. Huckert
*Assistant Examiner*—E. Wojciechowicz
*Attorney*—Harold Levine, James O. Dixon, Andrew M. Hassell, Melvin Sharp, Michael A. Sileo, Jr., Henry T. Olsen, Gary C. Honeycutt and John E. Vandigriff

[57] ABSTRACT

Anisotropic etching is employed in the fabrication of a Schottky barrier diode to provide a recessed geometry having a guard ring of reduced area, thereby avoiding the objectionable degree of parasitic capacitance found in related planar devices. A low series resistance is also provided since the anisotropic etching step inherently permits a precise control of the distance between the surface barrier and a buried substrate layer of low resistivity.

4 Claims, 8 Drawing Figures

INVENTOR
Tzu F. Shao

BY Gary C. Honeycutt
ATTORNEY

SCHOTTKY BARRIER DIODE

This invention relates to semiconductor devices having a surface barrier junction; and more particularly to a Schottky barrier diode having a recessed geometry wherein the junction is surrounded by a guard ring of unusually limited area, whereby parasitic capacitance is minimized.

Surface barrier diodes have long been recognized as having several potential advantages over p-n junction diodes, particularly in the design of microwave devices and digital integrated circuits. The Schottky diode has a much faster switching speed and is also characterized by a lower forward voltage for a given current. Because of these advantages and others, the use of Schottky diodes should permit the design of integrated circuits having reduced power dissipation and higher packing densities.

These potential advantages have not been fully realized because, until recently, no method of fabrication had been developed that would yield reproducible results. In addition, diode characteristics were often grossly different from theoretical design. These difficulties have recently been explained as due to high electric field concentrations at the periphery of the metal electrode. Known as "edge effects" these concentrations lead to spurious currents that dominate the ideal diode characteristics.

One prior solution to the problem involves the fabrication of a planar device wherein a diffused p-type guard ring is located in the semiconductor at the periphery of the metal electrode. This effectively eliminates edge effects by reducing the electric field concentrations and by moving the edge of the electrode away from the periphery of the barrier junction. This solution has disadvantages, however, since the guard ring for some applications should have a surface dopant concentration sufficiently low to permit rectifying contact with the metal electrode. This, in turn, seriously limits the choice of metals which can be used as the electrode. Also, the guard ring introduces additional parasitic capacitance which imposes an additional constraint upon circuit design.

Accordingly, it is an object of the present invention to provide a surface barrier diode wherein the guard ring solution to edge effects is employed without introducing an objectionable amount of parasitic capacitance. It is a further object of the invention to provide a Schottky barrier diode in which the guard ring occupies a substantially reduced area, thereby permitting increased packing densities in the design of integrated circuits. It is a further object of the invention to provide a surface barrier diode having reduced series resistance, and consequently a higher frequency limit.

Still further, it is an object of the invention to provide a method for the fabrication of a surface barrier diode having the above objects and advantages.

One aspect of the invention is embodied in a surface barrier junction device comprising a monocrystalline semiconductor body of one conductivity type having a depressed area in one surface thereof, and a surface barrier junction formed at the bottom of the depressed area surrounded by a guard ring of opposite conductivity type formed along the side walls of the depressed area.

For example, in the fabrication of a silicon device, a monocrystalline wafer of n-type conductivity is employed having a high resistivity surface region crystallographically oriented in the (100) plane. With the use of an oxide mask patterned in accordance with known techniques, a diffused region of p-type conductivity is formed in the high resistivity region. Then a depressed area is provided by exposing the wafer to an anisotropic etchant. A flat bottom is thereby obtained just below the p-type region, surrounded by side walls having a 54.7° slope. Metallization of the depressed area provides a surface barrier junction at the n-type bottom, surrounded by a p-type guard ring along the side walls.

Preferably, the same mask is used for both diffusion and etching. In this manner, the diffused region which remains after etching is primarily that portion which was formed by lateral diffusion under the mask. Guard ring area is thereby reduced substantially.

The invention is also embodied in a process for the fabrication of a surface barrier junction device beginning with the step of patterning an etch resistant mask on a monocrystalline semiconductor body having a surface region of high resistivity on a substrate of low resistivity. An aperture is provided in the mask, the diameter which is preferably 0.5 to 1.0 mil. The masked semiconductor body is then exposed to an anisotropic etchant for a time sufficient to form a flat bottomed depression in the high resistivity region. The bottom of the depression is then covered with an etch resistant mask, in addition to the initial mask which is retained on the semiconductor surface. A suitable impurity is then selectively diffused into the side wall regions of the depressed area for converting a shallow portion of the high resistivity semiconductor region to the opposite conductivity type. That portion of the etch resistant mask which covers the depression bottom is then removed, followed by the deposition of a suitable metal to cover the entire depression whereby a surface barrier junction is formed at the bottom, surrounded by the diffused side wall regions which act as a guard ring.

Preferably the semiconductor body is monocrystalline silicon crystalographically oriented to expose a (100) plane, and having first and second high resistivity regions on a substrate of low resistivity. In such an embodiment the surface region has the highest resistivity, and the etched depression is bottomed in the second (high resistivity) region adjacent the substrate, which region has a resistivity intermediate the resistivity of the substrate and the resistivity of the surface region.

The invention is also embodied in a process for the fabrication of a surface barrier junction device beginning with the step of forming an adherent, etch-resistant mask on a monocrystalline semiconductor body having a surface region of one conductivity type and a subjacent region of opposite conductivity type on a substrate of said opposite conductivity type, the substrate having a substantially lower resistivity than either the surface or the subjacent region. An aperture is provided in the mask, through which a flat-bottomed depression is anisotropically etched through the surface region, and bottomed in the subjacent region. A suitable metal is then deposited in the depression to form a surface barrier junction, the side walls of the depression being surrounded by the surface region which functions as a guard ring.

Figure 1:
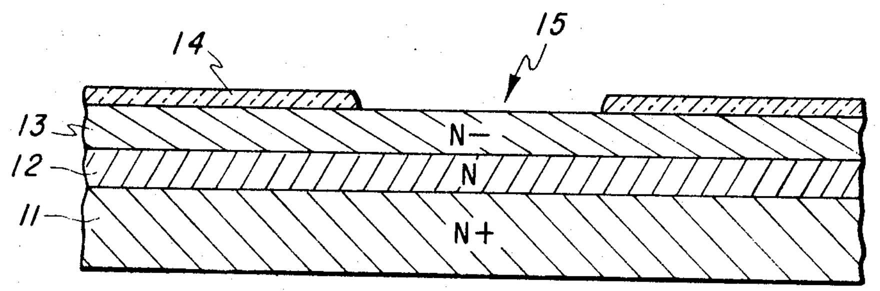
FIGS. 1 and 2 are enlarged cross-sectional views of a semiconductor wafer, illustrating intermediate stages in the fabrication of the surface barrier junction device in accordance with one embodiment of the invention.

As shown in FIG. 1 a monocrystalline silicon body 11 of n-type conductivity and having a resistivity of less than 0.01 ohm-centimeter is provided with a first epitaxial layer 12 having a resistivity of 0.1 to 1.0 ohm-centimeter and a second epitaxial layer 13 having a resistivity of about 2 to 10 ohm-centimeters. An etch resistant mask 14 of silicon dioxide or other suitable material is formed on the surface of layer 13 having an aperture 15 therein, having a suitable width preferably 0.5 to 1.0 mil.

Figure 2:
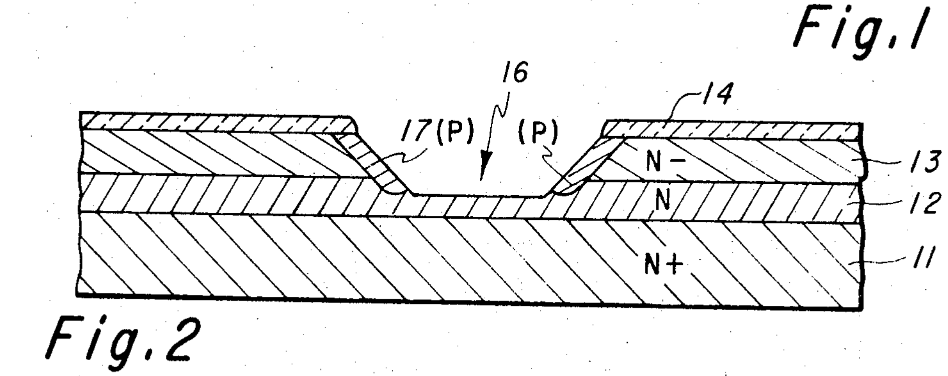

As shown in FIG. 2 the wafer then subjected to an orientation-dependent etch solution which selectively attacks the (100) planes in preference to other crystal planes. A suitable etchant consists of KOH, propanol and water, for example. The width of aperture 15 and the thickness of layer 13 are coordinated to provide an etched depression 16 having a flat-bottom portion located in layer 12. While retaining mask layer 14, an additional masking layer is provided in the bottom of depression 16 thereby exposing only the side wall portions of the depression. The wafer is then subjected to a suitable impurity at diffusion conditions, for the purpose of converting a shallow portion of the side wall regions 17 to p-type conductivity. The depression is then cleared of masking material and any oxide or glaze formed during the diffusion step, followed by the deposition of metallic film 18 which forms a surface barrier junction with the depression bottom, surrounded by guard ring region 17 of opposite conductivity type, to complete the device. Suitable metals for deposition as film 18 include molybdenum, nickel and titanium, for example.

Figure 3:
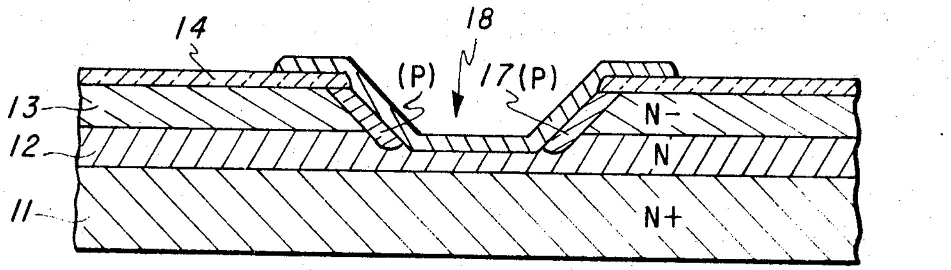
FIG. 3 is an enlarged cross-sectional view of one embodiment of a surface barrier junction device completed in accordance with the method illustrated by FIGS. 1 and 2.
Figure 4:
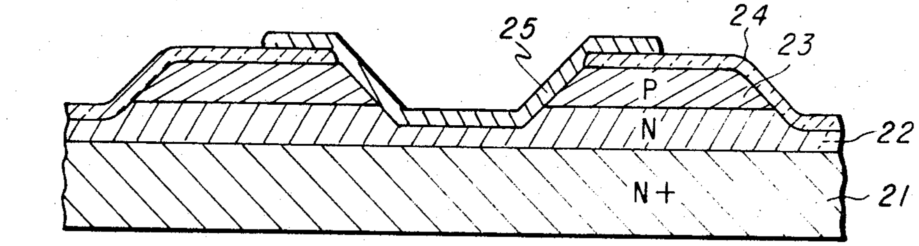
FIG. 4 is an enlarged cross-sectional view of a surface barrier junction device completed in accordance with an alternate method of the invention.

The embodiment shown in FIG. 4 is closely related to that shown in FIG. 3 and is fabricated by a similar sequence of steps. The initial wafer 21 is provided with a first epitaxial layer 22 which is the same as layer 12, but is covered by a second epitaxial layer 23 having p-type conductivity, which ultimately serves as the guard ring. An etch-resistant masking layer 24 is then formed on the surface of layer 23, analogous to masking layer 14 shown in FIG. 1. However, in this embodiment the masking layer covers a smaller area, whereby the preferential etching step achieves isolation of guard ring 23, concurrently with the formation of an anisotropic depression having a flat bottom located in layer 22. A suitable metal 25 is then deposited to form a surface barrier junction with the exposed portion of layer 22, surrounded by guard ring 23, similarly as in the embodiment of FIG. 3.

Figure 5:
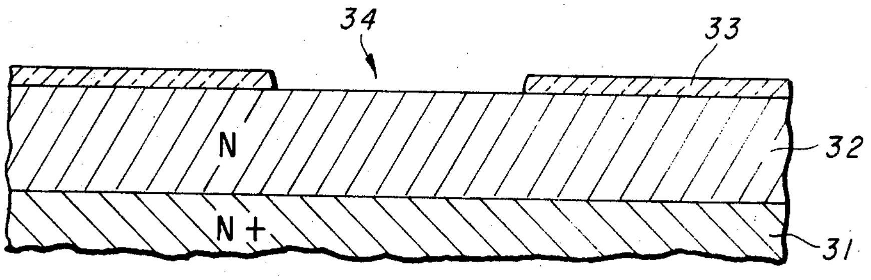
FIGS. 5, 6 and 7 are enlarged cross-sectional views of a semiconductor wafer, illustrating various intermediate stages in a process for the fabrication of a surface barrier junction device in accordance with one embodiment of the invention.
Figure 6:
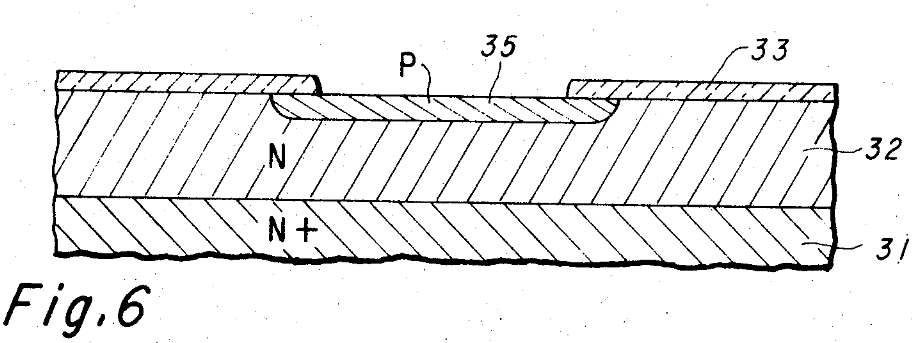

As shown in FIG. 5, an alternate embodiment of the invention begins with a monocrystalline silicon wafer 31 having a resistivity less than 0.01 ohm-centimeter, crystallographically oriented in the (100) plane. An epitaxial layer 32 having a resistivity in range of 0.1 to 1 ohm-centimeters is then provided on the substrate. An etch-resistant mask 33 of silicon dioxide or other suitable material is then patterned on layer 32 and provided with aperture 34 of any suitable width of preferably 0.5 to 1 mil. As shown in FIG. 6 a shallow p-type region 35 is selectively diffused into the surface of layer 32. Preferably region 35 is formed to depth of about 0.5 to 3 microns, and provided with a surface dopant concentration corresponding to a resistance of 50 to 400 ohms per square.

Figure 7:
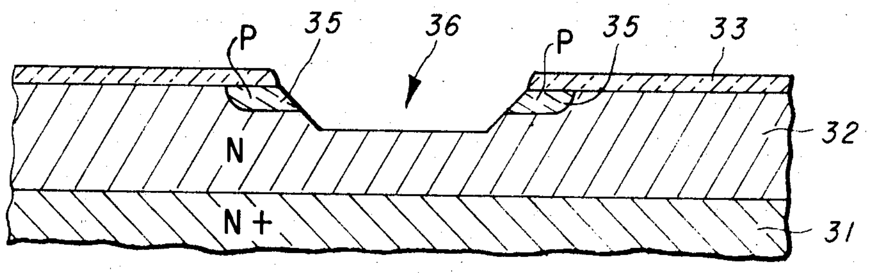

As shown in FIG. 7 the structure is then subjected to an orientation-dependent etch solution, using the same mask 33 as employed for the selective diffusion to form region 35. Etching is continued until depression 36 is bottomed within layer 32 at a depth just below region 35.

Figure 8:
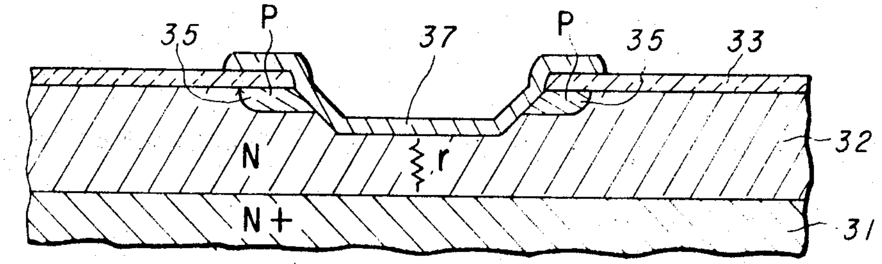
FIG. 8 is an enlarged cross-sectional view of a surface barrier junction device completed in accordance with the method of FIGS. 5, 6 and 7.

As shown in FIG. 8, a suitable metal 37 is then deposited to cover depression 36 whereby a surface barrier junction is formed with the exposed portion of n-type region 32, surrounded by the remainder of diffused region 35 which acts as a guard ring. The guard ring area is substantially less than prior art devices, since the only portion of region 35 which remains is that generated by lateral diffusion under mask 33.

Each of the above embodiments is characterized by substantially improved breakdown voltage, and a substantially reduced guard ring area. In addition, the series resistance of each embodiment is substantially less than that of prior art devices because of the relatively short distance between the surface barrier junction and the underlying substrate region. For example, in a prior art structure the distance between the surface barrier junction and the substrate is typically 5 microns, which represents the total thickness of the epitaxial region. In applicant's structure, however, this distance can be reduced to 2 microns or less since the surface barrier junction is formed at the bottom of the preferentially etched depression, which is readily susceptible to careful depth control and may therefore be bottomed at a distance of 2 microns or less from the substrate, within an epitaxial layer having a total thickness of 5 microns or more.

What is claimed is:

1. A surface barrier junction device comprising:

a monocrystalline semiconductor body of one conductivity type having a depression in one surface thereof, said depression having side walls and a bottom, said body including a substrate, a first layer disposed on said substrate, and a second layer disposed on said first layer, said substrate, said first layer, and said second layer being of progressively increasing resistivity such that said substrate is of low resistivity and said first and second layers are of high resistivity, with said first high resistivity layer having a resistivity intermediate that of said substrate and said second high resistivity layer, the bottom of said depression lying in said first high resistivity layer, at least a portion of the side walls of said depression extending through said second high resistivity layer, a region of opposite conductivity type provided in said semiconductor body, said region of opposite conductivity type being disposed in said second high resistivity layer and extending into said first high resistivity layer so as to provide a confining boundary about said depression forming the side walls thereof, an electrical conductor layer in said depression and including a conductor layer portion covering the bottom thereof in surface barrier contact with said first high resistivity layer and an upstanding continuous conductor layer portion overlying said region of opposite conductivity type which forms the side walls of said depression, and said electrical conductor layer being blocked from direct contact with said second high resistivity layer by said region of opposite conductivity type.

2. A surface barrier junction device as set forth in claim 1, further including an insulation layer disposed on said second layer and surrounding said depression in overlying relation to the upper end of said region of opposite conductivity type, and said electrical conductor layer having a marginal flange portion integral therewith and extending laterally from the upper end of said upstanding continuous conductor layer portion into overlying engagement with the portion of said insulation layer immediately surrounding said depression.

3. A device as in claim 2 wherein said semiconductor body is silicon, said substrate has a resistivity less than 0.01 ohm-centimeter, said first high-resistivity layer has a resistivity of 0.1 to 1.0 ohm-centimeter and said second high-resistivity layer has a resistivity of about 2 to 10 ohm-centimeters.

4. A device as in claim 3 wherein said monocrystalline silicon body has a (100) orientation and wherein said depression has flat sidewalls forming a 54.7° angle with the (100) plane.

* * * * *